April 28, 1959 W. H. SWAIN 2,884,492

DIRECT COUPLED SERIES AMPLIFIER

Filed Dec. 8, 1954

INVENTOR.
WILLIAM H. SWAIN

BY William R. Sherman

HIS ATTORNEY.

United States Patent Office 2,884,492

Patented Apr. 28, 1959

2,884,492

DIRECT COUPLED SERIES AMPLIFIER

William H. Swain, Mount Pleasant, N.Y., assignor, by mesne assignments, to Schlumberger Well Surveying Corporation, Houston, Tex., a corporation of Texas Application December 8, 1954, Serial No. 473,844

2 Claims. (Cl. 179—171)

Figure 1:
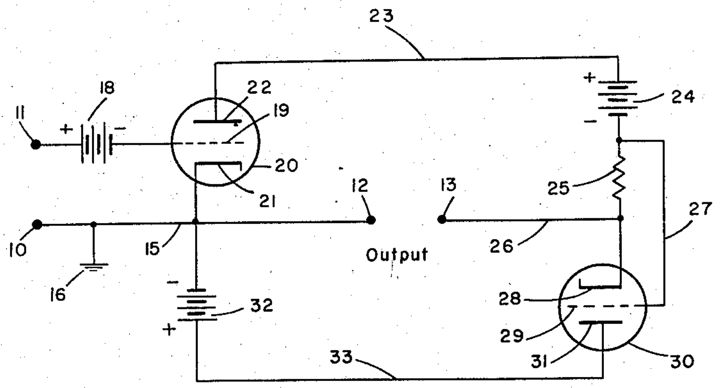

This invention relates to signal amplifying systems and, more particularly, to a direct coupled, push-pull amplifier having its input and output signals referred to the same reference or ground potential.

D.-C. signals furnished to recorders, galvanometers, and similar instruments commonly require amplification for proper instrument operation. Where the D.-C. signal fluctuates above and below a ground or reference potential, resort has been taken to series-connected triodes operating in push-pull relation. These triodes are series connected across an anode current supply in parallel with a voltage dividing network. With this arrangement, signals of either polarity may be developed between the junction of the triodes and a static balance point on the dividing network.

Dissipation of power, however, not only in the triodes but in the network as well renders such an amplifier inefficient in relation to the proportion of power transferred to the load. Moreover, it is difficult with such an arrangement to refer both the input and the output signals to the same ground potential as may be desired in many instances.

Accordingly, it is an object of this invention to provide new and improved apparatus for amplifying D.-C. signals which overcomes the above-recited disadvantages of prior art amplifying systems.

It is another object of this invention to provide an efficient amplifying system for both D.-C. and A.-C. signals balanced with respect to a reference potential.

Yet another object of this invention is to provide a D.-C. power amplifying system capable of substantial power amplification of signals extending well into the audio spectrum.

These and other objects of the invention are attained by series connecting a pair of signal amplifying devices in a loop, each device having an anode current supply connected in the loop, with a coupling resistor in the anode circuit of the input device for developing a signal to drive the second device in push-pull relation. An input signal is coupled to this loop circuit through the control electrode and cathode of the input device, while an output signal is derived from the cathodes of said devices.

In one embodiment, signal amplifying triodes are used in the loop circuit. In a second embodiment, beam power devices are employed and have associated with them circuits for deriving a regulated screen potential from the anode current supplies in a manner avoiding flow of regulator currents through the load or the coupling resistor.

Figure 2:
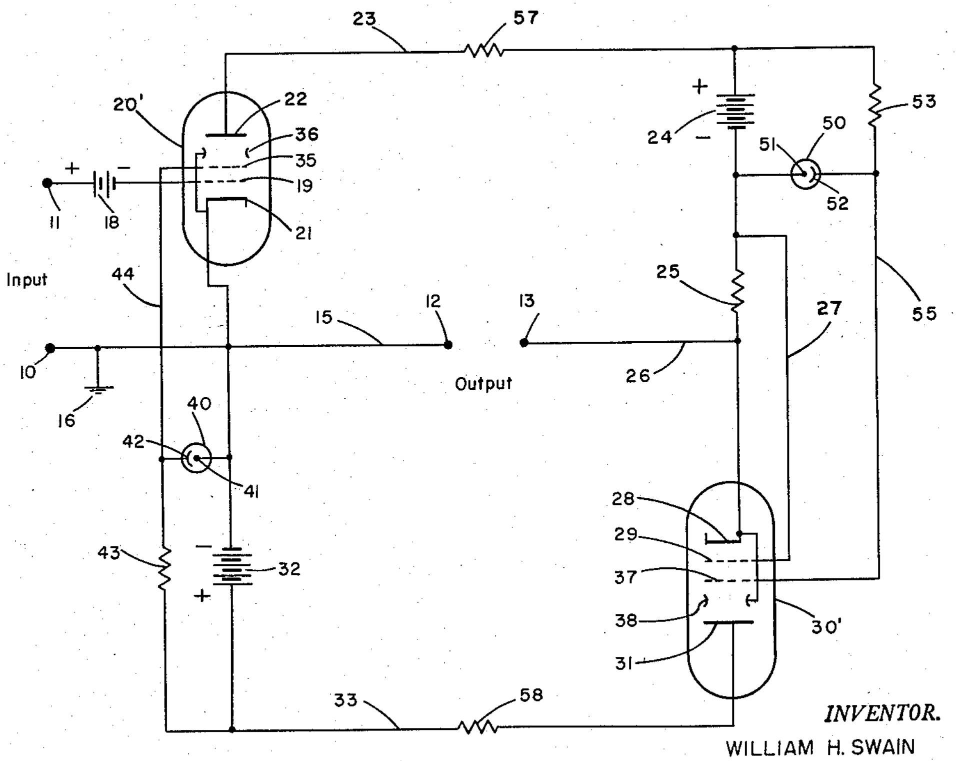

The invention and others of its objects and advantages will be more clearly perceived from the following detailed description, taken in conjunction with the drawing in which:

Fig. 1 is a circuit diagram of a signal amplifying system constructed in accordance with the invention; and Fig. 2 is a circuit diagram of a signal amplifying system representing an alternative embodiment of the invention.

In the figures like reference numerals are employed to designate elements similar in construction and function.

A signal amplifying system is shown in Fig. 1 arranged for amplification of D.-C. and A.-C. signals applied across input terminals 10 and 11 whereby D.-C. or A.-C. output signals at a higher power level may be developed across output terminals 12 and 13. In order that the input and output signals may be related to a common reference or ground potential, input terminal 10 and output terminal 12 are directly connected by a conductor 15 which may be grounded as indicated at reference numeral 16. Hence, a D.-C. signal of either polarity or an A.-C. signal applied at the input terminals will determine the potential at terminal 11 and, in a manner hereafter described, will govern the polarity or phase of the potential at output terminal 13 with respect to the reference potential of output terminal 12.

To this end, input terminal 11 is coupled through a source 18 of bias potential to the control electrode 19 of a signal amplifying device 20. The supply 18 has its negative terminal connected to the control electrode 19 to bias the same negatively with respect to cathode 21 of the signal amplifying device 20. As input terminal 10 is directly connected by conductor 15 to the cathode 21, a signal applied at the input terminals will be coupled to the control electrode 19 and cathode 21 of the signal amplifying device 20. Anode 22 of the device 20 connected by a conductor 23 with an anode current supply 24 will pass current to the cathode in accordance with the potential existing between the control electrode 19 and cathode 21.

The anode current supply 24, more particularly, has its positive terminal connected by conductor 23 to the anode 22 and its negative terminal connected through a coupling resistor 25 and conductor 26 to the output terminal 13. Direct current from the anode current supply 24 is thereby afforded a conductive path through an appropriate load device (not shown) connected across output terminals 12 and 13, which path comprises conductor 23, the signal amplifying device 20, conductor 15 connecting with output terminal 12, and conductor 26 connecting output terminal 13 with coupling resistor 25, the latter providing a current return to the anode current supply 24. With the circuit as thus far described, an output signal could be developed across terminals 12 and 13 with only a single polarity, that is, with the terminal 13 negative with respect to the reference potential on terminal 12.

In order that the polarity of the output signal may be reversed, coupling resistor 25 is connected by conductors 26 and 27 to cathode 28 and control electrode 29, respectively, of a second signal amplifying device 30. This second signal amplifying device 30, like the device 20, operates as a triode to control anode current flowing from its anode 31 to its cathode 28. Such anode current is derived from a separate second anode current supply 32 having its positive terminal directly connected by conductor 33 to the anode 31. A closed circuit for anode current from the supply 32 is then provided which, proceeding from the positive terminal, comprises conductor 33, the signal amplifying device 30, conductor 26, an appropriate load device connected across terminals 13 and 12, and conductor 15 connecting with the negative terminal of the supply 32. At the same time, an external loop circuit is provided comprising the series connected elements which, proceeding around the circuit in a positive current direction, are the anode current supply 24, the first signal amplifying device 20, the anode supply 32, the second signal amplifying device 30, and the coupling or cathode resistor 25.

It may be observed that the showing in Fig. 1 of the bias supply 18 and the anode current supplies 24 and 32 as batteries is illustrative only and that such supplies may comprise rectified sources of alternating current as well. Thus, for example, the anode supplies 24 and 32 may be provided as the rectified outputs from isolated secondary windings of a common power supply transformer (not shown). If desired, an anode resistor (not shown) might be connected by conductor 23 in series with anode 22, while another anode resistor could be connected by conductor 33 in series with anode 31, each for the purpose of limiting the plate dissipation in the triodes 20 and 30.

In operation, a signal applied to input terminals 10 and 11 is coupled to the cathode 21 and control electrode 19, respectively of the input triode 20 to control the anode current flowing therethrough. Such input signal may, for example, comprise a D.-C. potential fluctuating evenly above and below ground potential, or a D.-C. potential of either polarity with respect to ground potential, or an A.-C. potential of any frequency in the audio spectrum and extending downwardly to a zero frequency. The bias potential provided by supply 18 renders the operation of triode 20 either class A or $AB_1$, as desired.

Anode current flowing in a controlled manner through triode 20 will develop a potential across coupling resistor 25 which may have a value substantially identical to the input potential on terminals 10 and 11 but which is coupled to the control electrode 29 and the cathode 28 of the second triode 30 with an opposite phase or polarity from that of the input signal. This action of the coupling resistor 25 may be termed phase splitting and serves to drive the second triode 30 in push-pull relation to the first triode 20.

This push-pull operation may be exemplified by considering the operation of the circuit when a positive input signal changing toward negative is applied to the input terminals 10 and 11. In this instance a strong but decreasing anode current will flow through the input triode 20 and through the output load developing a negative polarity on output terminal 13 of decreasing magnitude. At the same time a negative signal of decreasing magnitude is coupled to the control electrode 29 of the second triode 30. Hence, a very small but increasing anode current is allowed to flow from the anode current supply 32 through the second triode 30 and thence through the output load tending to develop a positive polarity on the terminal 13. With a positive input signal, then, a negative output signal is derived, both signals being referred to the common ground potential at the grounding point 16. As the input signal swings to a negative value, however, the anode current of the second triode 30 exceeds that through the first triode 20 and develops a positive output signal on terminals 12 and 13.

Noteworthy is the fact that upon the extreme excursions of the input and hence the output signals, one of the triodes is substantially non-conducting and consumes an inappreciable amount of power. Hence, the greater the power developed in the output circuit, the less the proportion of the available power from the anode current supplies 24 and 32 is dissipated in the triodes 20 and 30. The absence of any voltage dividing network, frequently included in prior art D.-C. balanced power amplifiers, further renders this amplifying system very advantageous in its efficiency, particularly at high signal levels.

At the same time, by suitable selection or adjustment of the potential of the bias supply 18 and the resistance of coupling resistor 25, the output of the circuit may be balanced to have a zero value for a zero input signal.

For yet a greater efficiency of operation in obtaining power amplification, the signal amplifying system of Fig. 2 may be employed in which beam power amplifying devices 20′ and 30′ are substituted for the triode amplifying devices 20 and 30. Thus, the beam power device 20′ includes a screen electrode 35 and a beam forming electrode 36 directly connected to the cathode 28.

For proper operation of these beam power devices, it is necessary that their screen electrodes have a substantially fixed potential with respect to their cathodes. To this end, a voltage regulator tube 40 has its cathode 41 connected to the negative terminal of anode current supply 32 and its anode 42 connected through a current limiting resistor 43 to the positive terminal of the supply 32. The screen electrode 35 of the beam power device 20′ is then connected by conductor 44 to the junction of the voltage regulator tube 40 and the current limiting resistor 43. It is a characteristic of the voltage regulator tube 40, as is well known, to have a voltage drop between its anode and cathode substantially fixed in value irrespective of the current flowing therethrough. This relatively fixed potential is applied between the screen electrode 35 and the cathode 21 by the connection of the voltage regulator tube 40 to the cathode 21 and to the control electrode 35.

In a like manner, a voltage regulator tube 50 has a cathode 51 connected to the negative terminal of anode supply 24 and an anode 52 connected through a current limiting resistor 53 to the positive terminal of anode supply 24. The cathode 51 and anode 52 are connected to cathode 28 and screen electrode 37, respectively, of the beam power tube 30′ by resistor 25 and by conductor 55.

Anode resistors 57 and 58 are shown in Fig. 2 connected, respectively, in conductors 23 and 33 for limiting the plate dissipation in beam power tubes 20′ and 30′. The operation of the amplifying system of Fig. 2 is essentially similar to that of the system shown in Fig. 1. However, to obtain the proper operation of the beam power devices 20′ and 30′, regulator currents are passed from the anode supplies 32 and 24, respectively, through the voltage regulator tubes 40 and 50. The magnitude of the current flow is limited by the resistors 43 and 53, so that the voltage regulator tubes may be operated with a minimum drain upon the power supplies. Noteworthy is the avoidance of regulator current flow around either the external or internal loops.

In order that the power efficiency of the amplifying system may be as high as possible, the values of the anode resistors 57 and 58 are selected at the minimum necessary for the protection of the devices 20′ and 30′.

A satisfactory operation of the signal amplifying system of Fig. 2 may be obtained with the following exemplary circuit elements:

| | | |
|---|---|---|
| Beam power devices 20′ and 30′ | | Type 6146 |
| Voltage regulators 40 and 50 | | Type OA–2 |
| Anode resistors 57 and 58 | ohms | 1000 |
| Coupling resistor 25 | do | 250 |
| Resistors 43 and 53 | do | 7000 |
| Anode supplies 24 and 32 | volts | 400 |
| Bias supply 18 | do | 25 |

With a load resistance on the order of 3000 ohms, a voltage gain of 10 or better has been obtained. The circuit has been found responsive from the frequency of zero to frequencies on the order of 100 kilocycles and may provide output potentials plus or minus 200 volts D.-C. or output currents of plus or minus 100 milliamperes.

If desired, an enhanced stabilization of the amplifying system with respect to changing characteristics of the signal amplifying devices or drift in the supply potentials may be obtained by inverse feedback from the output terminals to the input circuit. Likewise, if desired, positive feedback may be employed in either or both of the internal circuit loops coupled to the output of the system. Screen grid potentials for the beam power devices 20′ and 30′ may, of course, be derived by other well known means, although the voltage regulator means disclosed herein affords the advantage that regulator currents are not passed through the output load or through the coupling resistor 25.

It will be evident then that the signal amplifying system of this invention serves efficiently to amplify an input signal applied to a single-ended input circuit, using a phase splitter to obtain push-pull operation, and yet providing an amplified signal of either polarity at a single-ended output. By this arrangement, input and output signals both referred to the same ground potential may be had.

It will be understood that the above-described embodiments of the invention are illustrative only and that modifications will occur to those skilled in the art. Such modifications lying within the true scope and spirit of the invention are intended to be included within the ambit of the appended claims.

I claim:

1. In a signal amplifying system, first and second signal amplifying devices each including an anode, a cathode, a control electrode, a screen electrode, and a beam forming electrode, means for applying an input signal potential between the control electrode and cathode of said first device, an output circuit connected to the cathodes of said first and second devices, a cathode resistor connected between the cathode and control electrode of said second device, first and second sources of anode current, means for connecting said first source between the anode of said first device and said cathode resistor to pass current through the anode-cathode path of said first device, said output circuit and said cathode resistor in series, means for connecting said second source between the anode of said second device and the cathode of said first device to pass current serially through the anode-cathode path of said second device and through said output circuit in a sense opposite to current passed through said output circuit from said first source, a first voltage regulator tube and current limiting resistor in series connected across said first source, means for applying the regulated voltage across said tube between the cathode and screen electrode of said second device, a second voltage regulator tube and current limiting resistor in series connected across said second source, and means for applying the regulated voltage developed across said second tube between the cathode and screen electrode of said first device, said first and second signal amplifying devices being responsive respectively to variations in said input signal and in the potential across said cathode resistor correspondingly to vary their respective anode currents by substantially the same magnitudes but in opposite senses to provide a balanced output signal.

2. An amplifier circuit comprising: first and second signal amplifying devices each including an anode, a cathode and a control electrode; first and second signal input terminals; a first conductor connecting the first input terminal to the control electrode of said first device; first and second signal output terminals; a second conductor connecting the second input terminal to the second output terminal and to the cathode of said first device for maintaining these two second terminals at the same potential level as the cathode of said first device; a third conductor connecting the first output terminal to the cathode of said second device; a cathode resistor connected between the cathode and control electrode of said second device; first and second sources of anode voltage; means connecting said first source between the anode of said first device and the control electrode side of said cathode resistor; and means connecting said second source between the anode of said second device and the cathode of said first device.

References Cited in the file of this patent

UNITED STATES PATENTS

| | | |
|---|---|---|
| 2,326,614 | Bowman | Aug. 10, 1943 |
| 2,438,960 | Blitz | Apr. 6, 1948 |
| 2,525,632 | Anderson | Oct. 10, 1950 |
| 2,679,029 | Jose | May 18, 1954 |

FOREIGN PATENTS

| | | |
|---|---|---|
| 412,182 | Great Britain | June 19, 1934 |
| 1,056,347 | France | Oct. 21, 1953 |